US008884638B2

(12) United States Patent
Karrer et al.

(10) Patent No.: US 8,884,638 B2
(45) Date of Patent: Nov. 11, 2014

(54) CIRCUIT ARRANGEMENT FOR MONITORING AN ELECTRICAL INSULATION

(75) Inventors: Volker Karrer, Regensburg (DE); Christian Kuschnarew, Würzburg (DE)

(73) Assignee: Continental Automotive GmbH, Hannover (DE)

( * ) Notice: Subject to any disclaimer, the term of this patent is extended or adjusted under 35 U.S.C. 154(b) by 1164 days.

(21) Appl. No.: 12/680,346

(22) PCT Filed: Sep. 24, 2008

(86) PCT No.: PCT/EP2008/062763
§ 371 (c)(1),
(2), (4) Date: Mar. 26, 2010

(87) PCT Pub. No.: WO2009/043772
PCT Pub. Date: Apr. 9, 2009

(65) Prior Publication Data
US 2010/0308841 A1    Dec. 9, 2010

(30) Foreign Application Priority Data

Sep. 28, 2007   (DE) .......................... 10 2007 046 483

(51) Int. Cl.
| | | |
|---|---|---|
| *H01H 31/12* | (2006.01) | |
| *G01R 27/18* | (2006.01) | |
| *G01R 27/02* | (2006.01) | |
| *G01R 31/12* | (2006.01) | |
| *G01R 31/02* | (2006.01) | |
| *G01R 31/00* | (2006.01) | |

(52) U.S. Cl.
CPC .............. *G01R 27/025* (2013.01); *G01R 27/18* (2013.01); *G01R 31/1272* (2013.01); *G01R 31/025* (2013.01); *G01R 31/006* (2013.01)
USPC ....... 324/754.01; 324/551; 324/522; 324/509

(58) Field of Classification Search
USPC .............................. 324/754.01, 551, 522, 509
See application file for complete search history.

(56) References Cited

U.S. PATENT DOCUMENTS 3,413,541 A * 11/1968 Swim et al. .................... 324/515
5,481,194 A *  1/1996 Schantz et al. ................ 324/522
(Continued)

FOREIGN PATENT DOCUMENTS

DE        10300539 A1    7/2004
DE        10304234 A1    8/2004
(Continued)

OTHER PUBLICATIONS

Jingxin, et al: "Research on Insulation Resistance On-Line Monitoring for Electric Vehicle", Electrical m~Machines and Systems, Sep. 27, 2005, pp. 814-817, vol. 1, XP010877521, Beijing, China.

*Primary Examiner* — Patrick Assouad
*Assistant Examiner* — Sean Curtis
(74) *Attorney, Agent, or Firm* — Laurence A. Greenberg; Werner H. Stemer; Ralph E. Locher

(57) ABSTRACT

A circuit configuration monitors the electrical insulation of an electrically conductive part in relation to a first pole and a second pole of an electrical power network for example, an electrical drive network in a hybrid vehicle. The circuit configuration is characterized in that between the electrically conductive part and the two poles, a voltage divider having at least two resistors is arranged in each case. A measuring unit is associated with each of the two voltage dividers and provided for measuring a partial voltage, which drops via at least one of the resistors. A switch unit is associated each with the two voltage dividers and is provided for alternately bypassing at least one of the resistors.

24 Claims, 1 Drawing Sheet

(56) References Cited

U.S. PATENT DOCUMENTS

| | | | |
|---|---|---|---|
| 5,889,643 A * | 3/1999 | Elms | 361/42 |
| 6,014,297 A * | 1/2000 | Clarey et al. | 361/42 |
| 6,731,116 B2 * | 5/2004 | Yamamoto et al. | 324/522 |
| 6,952,103 B2 * | 10/2005 | Herb et al. | 324/500 |
| 7,862,944 B2 * | 1/2011 | Hinz et al. | 429/430 |
| 8,232,806 B2 * | 7/2012 | Kawamura | 324/509 |

FOREIGN PATENT DOCUMENTS

| | | |
|---|---|---|
| EP | 1265076 A1 | 12/2002 |
| GB | 1504181 A | 3/1978 |

* cited by examiner

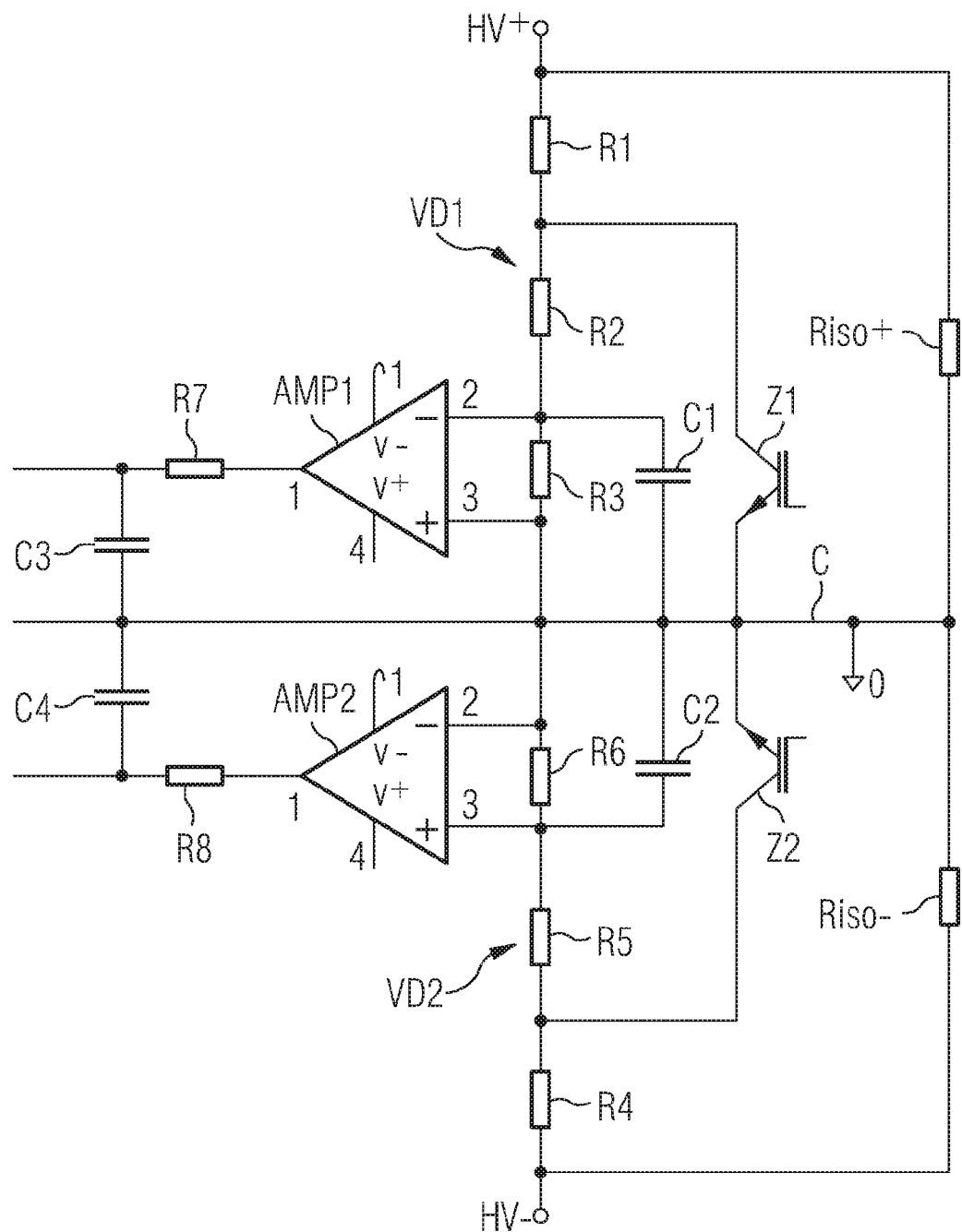

CIRCUIT ARRANGEMENT FOR MONITORING AN ELECTRICAL INSULATION

BACKGROUND OF THE INVENTION

Field of the Invention

The invention relates to a circuit arrangement for monitoring the electrical insulation of an electrically conductive part in relation to a first pole and a second pole of an electrical power network.

The insulation resistance of an electrical power network is generally understood to mean the ohmic resistance between electrical conductors or relative to earth potential. Since an ideal insulator does not exist, all insulators ultimately also form an ohmic resistance. Although this resistance may be very high, it does have a finite value. In accordance with DIN VDE 0105-100 and DIN VDE 0100-551, a minimum insulation resistance of 50 or 100 Ω/V is required in electrical installations and auxiliary circuits. Furthermore, for electrically propelled road vehicles, ISO 6469 stipulates an insulation resistance of 100 Ω/V for insulation class 1 and an insulation resistance of 500 Ω/V for insulation class 2.

When determining the insulation resistance of a power-supply network it is often desirable to be able to continuously measure the insulation resistance, for example in order to protect people against electric shock. If the insulation resistance is monitored continuously it is possible to react as quickly as possible and to signal the fault, even if there is a predetermined change to this resistance. For example it can thus be ensured that faults are discovered, signaled and action is taken in response, even before forced outage of a power-supply network.

When determining the insulation resistance of an electrical power network it is conceivable to first determine the fault current, that is to say the portion of the current flowing through the insulator. If the voltage is known the insulation resistance can be inferred directly from the ascertained fault current by way of a simple calculation. However, such a direct measurement of a fault current, which is usually very small in practice, is relatively costly and is often very unreliable.

In typical electric drive networks, as used for example in electric or hybrid motor vehicles, power controllers cause relatively high interference or interference potentials. When measuring fault current directly, interference of this type may lead to an incorrect response when monitoring insulation.

BRIEF SUMMARY OF THE INVENTION

In this context the object of the present invention is to provide a circuit arrangement for monitoring the electrical insulation of an electrical power network in relation to a conductive part, which arrangement makes it possible to reliably detect insulation faults and fault currents and to continuously monitor them despite being configured in a comparatively simple manner. In particular the invention makes it possible to monitor insulation in a reproducible manner, even if there is interference. In addition it is also possible to detect a fault relative to both the first and second potential and to differentiate between such faults.

The object underlying the invention is achieved with the aid of a circuit arrangement having the features disclosed in claim 1 and with a method according to claim 21. Advantageous embodiments of the invention are the subject of the dependent claims.

In accordance with the invention a circuit arrangement for monitoring the electrical insulation of an electrically conductive part relative to a first pole and a second pole of an electrical power network is developed in such a way
that a voltage divider comprising at least two resistors is arranged between the electrically conductive part on the one hand and each of the two poles on the other hand,
that a measuring device associated with each of the two voltage dividers is provided for measuring a partial voltage that drops across at least one of the resistors,
and that a switch device associated with each of the two voltage dividers is provided for optionally bypassing at least one of the resistors.

An essential feature of the solution according to the invention is thus the provision of a voltage divider in each case between a first and a second pole of the power-supply network and the potential of the conductive part of the power-supply network to be bypassed. This potential generally lies (or is set) between the first potential and the second potential of the power-supply network and may (but does not necessarily) comprise earth potential (or a 'ground potential'). Both the first and second potential are variable and may be (but are not necessarily) based on earth potential or a ground potential.

In the case of a d.c. network the 'first pole' and the 'second pole' of the power-supply network are the positive pole and the negative pole of said d.c. network. In the case of an a.c. network no fixed 'polarities' are associated with the poles and these polarities (positive and negative) change with operation of the power-supply network.

The term 'resistance' is understood very widely within the meaning of the invention as 'impedance'. The resistors of the voltage divider may thus be formed of resistances within the narrow sense of the word (ohmic resistances), but alternatively or additionally may also be formed, for example, of inductances and/or capacitances. It is merely their 'voltage-dividing function' that is essential, this possibly also being achieved in particular by inductances and/or capacitances when applying the monitoring process according to the invention to an a.c. network.

It is also essential to the invention that a switch is associated with each of the voltage dividers in such a way that the two voltage dividers can be selectively detuned by the different possible positions of the switch. In this instance detuning of the voltage divider is to be understood as meaning that, by changing the switch positions, the switch selectively changes the partial voltages (measuring voltages) dropping across the respective resistors, in such a way that the insulation resistances of the power-supply network can ultimately be determined from the varied measuring voltages.

A specific advantage of the invention is that a voltage measurement is already provided in many applications (for example for monitoring the operating potential or operating voltage of the power-supply network), in such a way that in these cases the invention is often realized merely by making a comparatively slight modification to a circuit arrangement that is already provided.

A specific development of the invention provides for the voltage dividers to each comprise at least three resistors. At least two of these resistors can preferably be bypassed by closing a switch arranged in parallel with these two resistors. Depending on the position of the switch the current thus flows either through the resistors connected in series, namely if the switch is in the open position, or the current flows through the switch bypassing the at least two resistors.

According to an advantageous embodiment of the invention, in each of the voltage dividers, which are in each case arranged between the electrically conductive part and a first (for example positive) or a second (for example negative) pole of the power-supply network to be monitored, the sum of the resistance values of the bypassable resistors ranges from 30 to 70% of the total sum of the resistance values. If the aforementioned resistors are thus bypassed owing to a corresponding change in the position of the switch, the resistance between the electrically conductive part and the first or second pole of the power-supply network is reduced by 30 to 70% on this current path. A 'detuning resistance change' of this magnitude has proven in practice to be particularly advantageous.

The preferred magnitude described above of the resistances (also described below as magnitude controls or 'resistance values') is in no way limited to the specific case of ohmic resistances. Of course magnitude controls of this type can also advantageously be provided when using coils, capacitors, etc. as 'voltage-dividing resistors'. It is mentioned merely by way of example that, for example in the case of an a.c. network, the voltage dividers may in each case be formed of at least two capacitors connected in series. In this instance the term 'resistance value' used here refers to the value of the 'a.c. resistance', this value being produced as a result of the operating frequency.

A further particularly specific development of the invention provides for the resistance value, which is decisive for the partial voltage drop, to be less than 10% of the total sum of the resistance values in at least one, preferably in each of the voltage dividers. With the aid of this technical measure it is ensured that the (dropping) voltage to be measured is also considerably smaller than the voltage dropping across the other resistors. This is very advantageous, in particular if the voltage between the two poles of the power-supply network is relatively large (for example greater than 100 V), because the measuring voltage can be measured more simply (and more cost-effectively). Changes in voltage, in particular those also caused by changed switch positions and/or a changing insulation resistance, can also be measured particularly simply in many applications by providing this technical measure.

In another specific embodiment of the invention the resistor of a voltage divider, at which the partial voltage provided in order to evaluate the measurement drops, is connected directly to the electrically conductive part. The circuitry can thus advantageously be produced both for the voltage divider arranged between the electrically conductive part and the first pole and for the voltage divider arranged between the electrically conductive part and the second pole. In particular it is therefore advantageously made possible for the conductive part to form a common input potential for the two measuring devices.

For example the electrically conductive part, which is connected to the first and second pole of the power-supply network in an electrically conductive manner via the respective voltage divider, is a passenger compartment, bodywork or frame part of a motor vehicle. It may be a part within the power-supply network, the potential of which for example lies in the middle between the potential of the first, for example positive, pole and the second, for example negative, pole. In principle the potential of the motor vehicle bodywork or the motor vehicle frame may also vary within the range between the potentials of the first and second poles. Generally these components of a motor vehicle represent earth based on the power-supply network and therefore normally have a potential of zero.

It is quite generally particularly important that electrically conductive parts that may be touched by people do not possess excessive electric potential. Instead it should be ensured that people who touch a corresponding part (for example a component in a motor vehicle or in a building) and for example earth the component with their body or a part of their body are not subjected to an inadmissibly high flow of current, that is to say they do not receive an electric shock.

It must therefore be ensured, in particular in the case of motor vehicles where the bodywork primarily consists of electrically conductive materials, that there is sufficient insulation between the power-supply network of a motor vehicle and the parts of the bodywork or that the insulation resistance of the power-supply network is sufficiently high. The electric potential of a motor vehicle bodywork also ultimately varies depending on the insulation resistance of a power-supply network and should not necessarily be equated with the earth potential of zero. It is also conceivable for the voltage between the electrically conductive part, for example a motor vehicle bodywork, and the first pole to be unequal to the voltage between the electrically conductive part and the second pole.

The circuit according to the invention makes it possible for the potential provided in the power-supply network between the two voltage dividers (at the 'conductive part') to variably slide between the potential of the first pole and the potential of the second pole.

In a particularly suitable embodiment of the invention the measuring devices each have a differential measuring amplifier, the respective partial voltage or measuring voltage being fed to the differential inputs of said amplifiers. In this case the partial voltage is in turn preferably the voltage dropping to a smaller voltage across a plurality of bypassable resistors. This technical measure also makes it possible to reliably detect comparatively smaller voltage differences.

Resistors in which the total sum of resistance values is greater than 1 MΩ are particularly suitable for use in voltage dividers. For example a sufficiently or acceptably small power dissipation (owing to the current flowing via the voltage dividers) is thus produced in most applications.

A very special development of the invention provides for the total sum of resistance values to be less than 10 MΩ in each of the voltage dividers. This is advantageous, for example with respect to the reliability and accuracy of detection of a faulty insulation.

In order to simplify the design, production and metrological connection of the circuit arrangement according to the invention it is also advantageous in many cases for the two voltage dividers to be substantially identical, i.e. for example to use components that have practically identical physical properties. In a specific embodiment the two voltage dividers are identical.

A further advantageous realization of the invention is distinguished in that the two measuring devices each comprise a filter on the input side and/or on the output side. These filters, for example provided to smooth the respective measuring voltage, ensure that voltages and voltage differences are detected and measured in a highly accurate manner, even if the values are comparatively low. In addition the effect of any interference signals can be avoided or at least considerably reduced using corresponding filters.

It is advantageous to arrange a resistor between an output of the measuring amplifier and the electrically conductive part, that is to say at the point of the power-supply network where the potential variably slides between the potentials of the two opposed poles. In this regard it is also conceivable to provide a capacitor between an output of the measuring amplifier and the electrically conductive part, either alternatively or in addition to the aforementioned resistor. A corresponding technical solution is particularly suitable in conjunction with the invention if a capacitor is arranged connected in series between an output of the measuring amplifier and the electrically conductive part. It is also conceivable to provide a capacitor between the electrically conductive part and each of the amplifier inputs of the measuring amplifiers.

In order to produce a comparatively simple circuit arrangement it is particularly advantageous for the two measuring devices to be substantially identical. It follows that a particularly suitable embodiment of the invention has two practically identical measuring devices, each of these devices possibly comprising a measuring amplifier and capacitors and/or resistors connected to said amplifier.

The circuit arrangement according to the invention is particularly suitable for use in motor vehicles, in particular road vehicles, having an electric drive. For example motor vehicles of this type may be electric motor vehicles such as electric cars, fuel cell buses or even 'trolley buses', i.e. buses powered by overhead wires. A preferred use of the invention is for 'hybrid' motor vehicles, such as hybrid cars or hybrid buses.

Motor vehicles that have an electric drive are particularly distinguished in that the voltages present between the first and the second pole of the electric drive network are at least occasionally greater than 60 volts under normal operating conditions and are thus life-threatening.

The circuit arrangement according to the invention for monitoring the electrical insulation is suitable, for example, for ensuring that the driver and any passengers are not subjected to excessively high electric voltages when they touch electrically conductive parts in a motor vehicle used for private or public transportation.

A specific embodiment of the invention provides for the circuit arrangement to be used in a d.c. network.

In addition to a circuit arrangement for monitoring the electrical insulation of an electrically conductive part relative to a first and a second pole of an electrical power network, the invention also relates to a corresponding method for monitoring insulation or an insulation resistance. The method according to the invention is characterized in that the voltages between the electrically conductive part on the one hand and the two poles on the other hand are each divided using a voltage divider comprising at least two resistors, in that a partial voltage is measured at each of the two voltage dividers, and in that at least one of the resistors is occasionally bypassed by a switch device under normal operating conditions during the monitoring process.

With the aid of the method according to the invention it is ensured in a simple manner that the insulation resistance of a power-supply network can be monitored continuously and in a highly accurate manner despite interference effects.

In a very special development of the method according to the invention different switch positions of the switch devices are passed through under normal operating conditions when monitoring the electrical insulation resistance of a power-supply network, that is to say automatically for example and preferably in a cyclic sequence. For example the corresponding cycles may be arranged in a corresponding control unit. In this case, the arrangement in a central motor vehicle control computer for example is suitable.

If it is established during monitoring of the insulation resistance that the insulation resistance is below an admissible threshold, at least at one point of the power-supply network, a corresponding error message may thus be generated and stored in a central computer unit and/or a corresponding warning signal may be given. For example the driver of a motor vehicle, for example a motor vehicle having an electric drive, (in particular a hybrid motor vehicle for example) may thus advantageously be made aware of the presence of an inadmissibly low insulation resistance or of a fault current that is too high. A forced outage of the power-supply network may also be effected (for example if it is established by the evaluation unit that predetermined criteria have been fulfilled).

The invention will now be described further with reference to an exemplary embodiment and to the appended drawing, in which:

BRIEF DESCRIPTION OF THE DRAWING

FIG. 1 is a circuit arrangement for monitoring electrical insulation in a hybrid motor vehicle.

DESCRIPTION OF THE INVENTION

In accordance with the embodiment the circuit arrangement is used in a motor vehicle having a hybrid drive, i.e. a motor vehicle in which an internal combustion engine is arranged in parallel or in series with an electric motor as a drive.

In the motor vehicle the insulation resistance is monitored between an electrically conductive bodywork or frame part C and both a positive pole HV+ and a negative pole HV− of the motor vehicle power-supply network. When the power-supply network is operated voltages measuring some $10^2$ V are typically present between HV+ and HV−, these voltages being provided by a corresponding battery (not shown).

A voltage divider VD1 is arranged between the bodywork part C and the positive pole HV+. A further voltage divider VD2 is arranged between the bodywork member C and the negative pole HV−.

The arrangement of the voltage dividers VD1 and VD2 is further distinguished in that they may each sometimes be bypassed using switches Z1 and Z2. The switch Z1 is thus associated with the voltage divider VD1 and the switch Z2 is associated with the voltage divider VD2.

In the example illustrated the voltage divider VD1 consists of resistors R1, R2 and R3, which are arranged connected in series between the electrically conductive bodywork member C and the positive pole HV+ of the power-supply network. The switch Z1 is arranged relative to the resistors in such a way that, on the one hand, it is connected in an electrically conductive manner to the bodywork member C and, on the other hand, it is connected to a circuit node between the resistors R1 and R2. The resistors R2 and R3 may be bypassed according to the switch position. Depending on the switch position of Z1, current thus optionally flows through the resistors R2 and R3 (open switch position) or via the switch Z1 (closed switch position).

The other resistor R1 is connected in series between the resistors R2 and R3 (bypassable by the switch Z1) and the positive pole HV+ of the power-supply network.

Of the three resistors R1, R2 and R3 connected in series, resistors R1 and R2 each have an (ohmic) resistance value (in the example illustrated) of 1 MΩ, whilst the resistor R3 has a resistance value of 1 kΩ. Resistances of this magnitude ensure that the partial voltage (also known as the measuring voltage) dropping across resistor R3 is considerably smaller than the respective voltages dropping across resistors R1 and R2.

A capacitor C1 is arranged parallel to the resistor R3 and, on the one hand, is conductively connected to the motor vehicle bodywork C and, on the other hand, is connected to a circuit node between R2 and R3. In particular the capacitor C1 smoothes the measuring signal and thus also reduces the effect of interference.

The two terminals of the resistor R3, between which, as described, only a small partial or measuring voltage drops, are connected to the two inputs of a differential measuring amplifier AMP1, via which the measuring voltage dropping across the resistor R3 is amplified. The output of the differential amplifier AMP1 is connected to the motor vehicle bodywork C via a series connection from a resistor R7 and a further capacitor C3. The output signal of the amplifier AMP1 is fed to an evaluation device (not shown), which may for example form part of the aforementioned central motor vehicle control computer.

In addition to the measuring device provided between the motor vehicle bodywork C and the positive pole HV+ and comprising the voltage divider VD1, the current path of the fault current is also shown schematically in the figure and is determined by the size of an insulation resistance Riso+.

If there is an insulation fault in the power-supply network, the insulation resistance Riso+ decreases and the fault current increases accordingly. Since the present exemplary embodiment illustrates monitoring of a power-supply network in an electrically propelled road vehicle, ISO 6469 stipulates, depending on the insulation class, insulation resistances of from 100 Ω/V (insulation class 1) to 500 Ω/V (insulation class 2). In particular it is possible to continuously monitor insulation resistance using the circuit arrangement illustrated in the figure, in such a way that if the threshold provided in the central motor vehicle control computer is not met then a corresponding error message and a warning signal are transmitted to the driver.

In addition to giving an error message and a warning signal it is also conceivable to automatically shutdown the power-supply network in a motor vehicle depending on the operating mode, the extent to which and/or the speed at which the threshold is exceeded. In any case it should be ensured in a motor vehicle that it is possible to operate the safety-relevant motor vehicle components, at least for a specific length of time, despite the power-supply network being shutdown.

Previously only the part of the circuit arrangement arranged in the region between the motor vehicle bodywork C and the positive pole HV+ was discussed in detail when describing the figure. In order to avoid repetition, reference is now made to the fact that the part of the circuit arrangement located between the motor vehicle bodywork C and the negative pole HV− is identical to the aforementioned part and also uses identical components. In the figure the motor vehicle bodywork C thus represents an axis of symmetry in a known manner.

It is in turn essential that a voltage divider VD2 is formed by resistors R4, R5 and R6 at the part of the circuit arrangement located between the motor vehicle bodywork C and the negative pole HV− of the power-supply network, it being possible to occasionally bypass said voltage divider using the switch Z2. R6 acts as a measuring resistor and has a comparatively low resistance value compared to the other resistors R4 and R5. The voltage dropping across the resistor R6 is amplified by a differential measuring amplifier AMP2 and evaluated. In the example illustrated the switches Z1 and Z2 are configured as transistors (FETs).

An insulation fault occurring in the motor vehicle power-supply network relative to both a positive potential and a negative potential can be determined and differentiated using the illustrated circuit arrangement. As is further described below, it is also possible to establish if the insulation is faulty relative to both positive potential and negative potential (generally: relative to the first potential and relative to the second potential).

Three different operating modes and their detection by the evaluation unit will now be described in greater detail with reference to the described circuit arrangement illustrated in the figure.

In a first operating mode ("correct insulation") both insulation resistances Riso+ and Riso− are very large (ideally 'infinitely large' and in practice are greater than 10 MΩ for example).

In this case a potential is set at the bodywork part C, this potential merely being substantially dependent on the size of the two voltage dividers VD1 and VD2. In the example illustrated this potential thus lies in the middle between the potentials HV+ and HV− owing to the identical configuration of the two voltage dividers. For example if the potentials HV+ and HV− are provided by a battery having a battery voltage of 400 V, HV+, C and HV− thus have potentials of +200 V, 0 V and −200 V.

In this normal case the voltages dropping across resistors R3 and R6 are of identical size. This is detected by the evaluation unit arranged downstream of the two measuring amplifiers AMP1 and AMP2.

A further characteristic of this first, correct operating mode is that the potential set at the bodywork part C is substantially merely dependent on the size of the voltage dividers VD1 and VD2 (as well as on the specific switch position), even in the case of an optional detuning of the two voltage dividers VD1 and VD2 by closing at least one of the switches Z1 and Z2. This is also detected by the evaluation unit in order to clearly identify the first operating mode.

The result of this monitoring process is therefore that the insulation resistances (Riso+ and Riso−) of the power-supply network do not fall below the thresholds, in such a way that further operation of the power-supply network and of the electric drive is quite safe.

In a second operating mode ("Riso+ or Riso− too low") an inadmissibly low insulation resistance (or inadmissibly large fault current flowing via Riso+ or Riso−) is present either between the motor vehicle bodywork and the positive pole HV+ or between the motor vehicle bodywork and the negative pole HV−.

In this operating mode the electric potential of the motor vehicle bodywork C is shifted, depending on the size of the fault current, either in the direction of the potential at the positive pole HV+ or in the direction of the potential at the negative pole HV−, when the switches Z1 and Z2 are open. In this case the partial voltages that are detected by the differential measuring amplifiers AMP1, AMP2 and that drop across the resistors R3 and R6 are consequently of varying size. This is detected without difficulty by the evaluation unit and leads to a corresponding error message and to other safety measures (for example shutdown of the power-supply network).

However it should be noted here that it is still necessary to carry out at least one evaluation in a further switch position of the switches Z1 and Z2 in order to clearly detect this second operating mode in which either Riso+ or Riso− is inadmissibly low. A deviation between the measuring voltage dropping at R3 and the measuring voltage dropping across R6 when the switches Z1 and Z2 are open may also be produced, namely by a third operating mode ("Riso+ or Riso− too low").

However it is possible to differentiate without difficulty between the second operating mode and the third operating mode (or between the first and third operating modes) by evaluating measuring voltages in various switch positions of the switches Z1 and Z2. The potential set at the motor vehicle bodywork C is shifted in both operating modes by selectively detuning the two voltage dividers VD1 and VD2 by closing at least one of the switches Z1 and Z2. However the scale of the shift of the potential at the bodywork C is different in the second and third operating states. Both of the fault currents or both of the insulation resistances Riso+ and Riso− can thus be ascertained in the evaluation unit via the partial voltages detected for various switch positions. If a threshold is exceeded an error message and a warning signal may be generated, which can give information regarding the type and scale of the insulation fault.

The circuit arrangement is thus suitable for reliably monitoring both insulation resistances and, in addition, for determining any faults relative to negative and positive potential (a combination of these two faults can also be determined qualitatively and quantitatively).

In one embodiment of a monitoring method the switches are closed and opened in succession in that the switch Z1 is first closed and then opened again before the switch Z2 is opened and then closed again.

The length of time for which the switches are closed is, for example, approximately 1 min. in each case. A monitoring cycle consisting of three monitoring phases (first phase: both switches are open; second phase: one of the switches is closed; third phase: the other of the switches is closed) is thus produced. The voltages dropping across the resistors R3 and R6 are detected during each phase.

The operating mode that is momentarily present can thus be detected unequivocally by a corresponding evaluation of these measuring voltages, and the size of the fault currents or insulation resistances Riso+ and Riso− can also be determined in a simple manner.

The application of Ohm's law or of Kirchhoff's rules to the resistance network consisting of the resistors R1 to R6, Riso+ and Riso−, this application being suitable for example for the above-mentioned determination process, is fully known to the person skilled in the art and does not need to be explained further here.

In this regard it should be noted that the monitoring method according to the invention in no way assumes that the electrical resistance of the switch devices used (in this case: switches Z1 and Z2 are configured as switch transistors) has a specifically low electrical resistance value ("on" resistance) when the switch is closed. Instead, it is easily possible for an appropriate switch device to have a nominal "on" resistance and to be arranged in series with a resistor member. In this case it is merely essential to insulation monitoring for the corresponding "on" resistance to be known and taken into consideration when evaluating the measuring voltages in order to ascertain fault currents or insulation resistances.

In this regard it should also be noted that in practice it is not necessary in each case for both measuring voltages (across R3 and R6) to be fed for evaluation for all switch positions of the switches Z1 and Z2. For example in the embodiment illustrated there is only one voltage across the resistor R3 and the inputs of the differential amplifier AMP1 when the switch Z1 is open, whereas there is only one voltage across the resistor R6 and the inputs of the differential amplifier AMP2 when the switch Z2 is open. In the circuit arrangement shown it is accordingly unnecessary, for example, to measure the voltage dropping across R3 when the switch Z1 is closed (at least when the "on" resistance of Z1 can be disregarded relative to the sum of the resistances of R2 and R3).

To summarize, the measuring voltages detected for various switch positions are transferred to an evaluation unit where, with reference to the changed measuring voltages, the actual insulation resistances or any fault currents that may be present are calculated. It is thus possible to ascertain the fault both relative to the potential at the first (for example positive) pole and relative to the potential at the second (for example negative) pole and to reliably distinguish these faults from one another.

If the insulation resistances or fault currents in a power-supply network of a hybrid motor vehicle are monitored continuously, detection and evaluation, on the one hand, and the control, on the other hand, of the switches Z1 and Z2 are preferably carried out in a fully automated manner in a predeterminable cycle. The measuring times, the duration of the measurements, the times at which the switches Z1 and Z2 are opened or closed and also the length of time for which the switches remain open or closed respectively are accordingly deposited in the motor vehicle control computer. In each case a measuring cycle preferably runs for a period ranging from approximately 1 ms to a few minutes (for example a few seconds) and is repeated following a predeterminable operating period of the motor vehicle.

In contrast to the aforementioned monitoring method comprising three different monitoring phases (switch positions), a fourth position may also be provided as a further monitoring phase, in which both switches Z1 and Z2 are closed (for instance to provide a further, redundant measuring result).

The described circuit arrangement and the method for monitoring the insulation of a power-supply network thus represent one option for determining the insulation resistance of a motor vehicle and any possible faults in a comparatively simple and highly accurate manner. Continuous monitoring may thus also be achieved in a simple manner.

The invention claimed is:

1. A circuit configuration for monitoring electrical insulation of an electrically conductive part relative to a first pole and a second pole of an electrical power network, the circuit configuration comprising:
   a first voltage divider connected between the electrically conductive part and the first pole, and a second voltage divider connected between the electrically conductive part and the second pole, said first voltage divider having at least two resistors and said second voltage divider having at least two resistors;
   a first measuring device coupled to said first voltage divider for measuring a partial voltage that drops across at least one of said at least two resistors of said first voltage divider;
   a second measuring device coupled to said second voltage divider for measuring a partial voltage that drops across at least one of said at least two resistors of said second voltage divider;
   a first switch device connected to said first voltage divider, said first switch device having a conduction state in which at least one of said at least two resistors of said first voltage divider is bypassed; and
   a second switch device connected to said second voltage divider, said second switch device having a conducting state in which at least one of said at least two resistors of said second voltage divider is bypassed.

2. The circuit configuration according to claim 1, wherein said first voltage divider and said second voltage divider each have at least three resistors.

3. The circuit configuration according to claim 2, wherein said first switch device bypasses at least two of said at least three resistors of said first voltage divider in the conducting state thereof, and said second switch device bypasses at least two of said at least three resistors of said second voltage divider in the conductiong state thereof.

4. The circuit configuration according to claim 3, wherein in each of said first and second voltage dividers a sum of resistance values of bypassable resistors ranges from 30% to 70% of a total sum of the resistance values.

5. The circuit configuration according to claim 1, wherein each of said first and second voltage dividers a resistance value, which is decisive for a drop of the partial voltage, is less than 10% of a total sum of the resistance values.

6. The circuit configuration according to claim 1, wherein each of said first and second voltage dividers a resistance value, which is decisive for a drop of the partial voltage, that is connected electrically and directly to the electrically conductive part.

7. The circuit configuration according to claim 1, wherein said first and second measuring devices each have a differential measuring amplifier with a differential input, the partial voltage respectively being fed to said differential input of said differential measuring amplifier.

8. The circuit configuration according to claim 1, wherein in each of said first and second voltage dividers a total sum of resistance values is greater than 1 MΩ.

9. The circuit configuration according to claim 1, wherein in each of said first and second voltage dividers a total sum of resistance values is less than 10 MΩ.

10. The circuit configuration according to claim 1, wherein said first and second voltage dividers are identical.

11. The circuit configuration according to claim 7, wherein said first and second measuring devices including two measuring devices which each have a filter on at least one of an input side and on an output side.

12. The circuit configuration according to claim 7, further comprising a further resistor disposed between an output of said differential measuring amplifier and the electrically conductive part.

13. The circuit configuration according to claim 7, wherein said filter has a capacitor disposed between an output of said differential measuring amplifier and the electrically conductive part.

14. The circuit configuration according to claim 7, wherein said filter has a resistor and a capacitor disposed connected in series between an output of said differential measuring amplifier and the electrically conductive part.

15. The circuit configuration according to claim 7, wherein said filter has a capacitor disposed between the electrically conductive part and an amplifier input of each of said differential measuring amplifiers.

16. The circuit configuration according to claim 1, wherein said first and second measuring devices include two measuring devices which are identical.

17. The circuit configuration according to claim 1, wherein the electrically conductive part is a chassis part of a motor vehicle.

18. The circuit configuration according to claim 1, wherein the electric power network supplies at least one electric drive motor of a motor vehicle.

19. The circuit configuration according to claim 1, wherein a voltage present between the first pole and the second pole is potentially greater than 60 V under normal operating conditions.

20. The circuit configuration according to claim 1, wherein the electric power network is a d.c. network.

21. The circuit configuration according to claim 1, wherein the electric power network supplies at least one electric drive motor of a hybrid motor vehicle.

22. The circuit configuration according to claim 1, wherein a voltage present between the first pole and the second pole is potentially greater than 100 V under normal operating conditions.

23. The circuit configuration according to claim 1, wherein said first voltage divider is non-switchably connected between the electrically conductive part and the first pole, and said second voltage divider is non-switchably connected between the electrically conductive part and the second pole.

24. The circuit configuration according to claim 1, wherein:
said first switch device is connected to said first voltage divider such that in the conducting state thereof, said first switch device conducts a current from another one of said at least two resistors of said voltage divider while said one of said at least two resistors of said first voltage divider is bypassed; and
said second switch device is connected to said second voltage divider such that in the conducting state thereof, said second switch device conducts a current from another one of said at least two resistors of said second voltage divider while said one of said at least two resistors of said second voltage divider is bypassed.

* * * * *